(12) United States Patent
Chen et al.

(10) Patent No.: US 6,604,566 B1
(45) Date of Patent: Aug. 12, 2003

(54) LAMINATOR MEMBER WITH FLUOROCARBON SILANE COUPLING REAGENT

(75) Inventors: Jiann-Hsing Chen, Fairport; Biao Tan, Rochester; Joseph A. Pavlisko, Pittsford; Robert A. Lancaster, Hilton; Craig M. Cody, Scottsville, all of NY (US)

(73) Assignee: NexPress Solutions LLC, Rochester, NY (US)

( * ) Notice: Subject to any disclaimer, the term of this patent is extended or adjusted under 35 U.S.C. 154(b) by 0 days.

(21) Appl. No.: 09/409,962

(22) Filed: Sep. 30, 1999

(51) Int. Cl.[7] .................. B30B 5/06; B30B 15/34
(52) U.S. Cl. .................. 156/555; 156/582; 156/583.5; 100/151
(58) Field of Search .................. 156/555, 580, 156/582, 583.1, 583.5; 100/306, 311, 313, 151, 153, 154

(56) References Cited

U.S. PATENT DOCUMENTS

| | | | | |
|---|---|---|---|---|
| 4,080,241 A | * | 3/1978 | Grevich et al. | 156/498 |
| 4,087,394 A | | 5/1978 | Concannon | 524/104 |
| 4,997,507 A | * | 3/1991 | Meyer | 156/286 |
| 5,034,087 A | * | 7/1991 | Denker et al. | 156/555 |
| 5,121,683 A | * | 6/1992 | Bielfeldt | 100/38 |
| 5,203,942 A | | 4/1993 | DeCook et al. | 156/230 |
| 5,411,779 A | | 5/1995 | Nakajima et al. | 428/36.91 |
| 5,478,434 A | | 12/1995 | Kerr et al. | 156/584 |
| 5,791,239 A | * | 8/1998 | Lauderbaugh et al. | 100/48 |
| 5,948,491 A | | 9/1999 | Chen et al. | 428/35.7 |
| 6,213,183 B1 | * | 4/2001 | Kerr et al. | 156/358 |

OTHER PUBLICATIONS

Principles of Polymerization, 2nd Ed., George Odian, pp. 153–154, John Wiley & Sons, Inc.
Textbook of Polymer Science, 3rd Ed., Fred W. Billmyer, Jr., pp. 427–428, John Wiley & Sons, Inc.

* cited by examiner

Primary Examiner—James Sells

(57) ABSTRACT

A laminator member for color proofing comprising a belt substrate; and a surface layer, said surface layer comprising: a polyamic-imide organic polymer binder; a fluorinated resin polymer; and a perfluoroalkylsubstituted fluororesin-reactive compound having the formula:

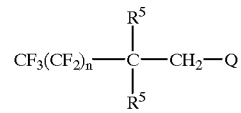

where $R^5$ is H or F; Q is OH, $SiR^6R^7R^8$; $R^6$, $R^7$, and $R^8$ being independently selected from the group consisting of Cl, OH, an alkyl group containing 1 to about 4 carbon atoms, an alkoxy group containing 1 to about 4 carbon atoms, an acyloxy group containing 2 to about 4 carbon atoms, and an amino group containing 0 to about 4 carbon atoms; and n is an integer from 1 to about 15; with the proviso that, at least one of $R^6$, $R^7$, and $R^8$ is Cl, OH, or an alkoxy, acyloxy, or amino group; and wherein said surface layer is adhered to said belt substrate by the polyamide-imide polymer binder.

11 Claims, No Drawings

LAMINATOR MEMBER WITH FLUOROCARBON SILANE COUPLING REAGENT

CROSS REFERENCE TO RELATED APPLICATIONS

Reference is made to commonly assigned U.S. patent application Ser. No. 09/409,291, filed herewith, entitled "A Novel Adhesion Priming Composition for Fluoropolymer Coatings" by Jiann-Hsing Chen, Biao Tan, Joseph A. Pavlisko and Robert A. Lancaster and U.S. patent application Ser. No. 09/408,693, filed herewith, entitled "A Coated Laminator Member for Color Proofing and Methods of Making Same" by Biao Tan, Joseph A. Pavlisko, Mary Ellen O'Neill, Robert A. Lancaster and Charles E. Hewitt, the disclosure of which is incorporated herein.

FIELD OF THE INVENTION

The present invention relates to the art of color proofing, and in particular, to a laminator member for preparing prepress color proofs. More particularly, this invention relates to an improved lamination member that includes a new reinforcing fluorocarbon silane coupling reagent additive.

BACKGROUND OF THE INVENTION

Prepress color proofing is a procedure that is used by the printing industry for creating representative images of printed material to check for color balance and other important image quality control parameters, without the high cost and time that is required to actually produce printing plates and set up a printing press to produce an example of an intended image. These intended images may require several corrections and may be reproduced several times to satisfy or meet the requirements of the customers, resulting in a large loss of profits and ultimately higher costs to the customer.

Generally speaking, color proofs sometimes called "off press" proofs or prepress proofs, are one of three types: namely (1) a color overlay that employs an image on a separate base for each color; (2) a single integral sheet process in which the separate color images are transferred by lamination onto a single base; and (3) a digital method in which the images are produced directly onto or transferred by lamination onto a single base from digital data.

In one typical process for a prepress color proofing system used in the printing industry, a multicolor original is separated into individual transparencies, called color separations, the three subtractive primaries and black. Typically a color scanner is used to create the color separations and in some instances more than four-color separations are used. The color separations are then used to create a color proof sometimes called an "off press" proof or prepress proof as described above.

A KODAK Color Proofing Laminator can be used to bond lamination sheets to receiver stock as a part of a color proofing system. The lamination sheets include a carrier and a layer of material to be applied to the receiver stock, which, in the case of the Kodak Color Proofing Laminator, is a color donor. A lamination sheet is laid upon the receiver stock with the color donor side sandwiched between the carrier and the receiver stock forming a lamination sandwich.

FIG. 1 in U.S. Pat. No. 5,478,434 shows a laminator 12. As shown in that FIG. 1, a lamination sandwich 10 sits on an entrance table 20. A leading edge of lamination sandwich 10 is fed into a laminator 12 which includes an upper heated pressure roller and a lower heated pressure roller. Lamination sandwich 10 passes completely through the upper heated pressure roller and the lower heated pressure roller. Lamination sandwich 10 thereafter exits the upper heated pressure roller and the lower heated pressure roller and comes to rest on an exit table 14 undisturbed until the trailing edge is cool to the touch; whereupon the top-most carrier can be peeled away from receiver stock and from the transferred color donor. With the configuration of an upper heated pressure roller and a lower heated pressure roller as described above, the laminator is called a straight-through laminator. Further details of this type of lamination/delamination system can be found in the above. As an additional reference, U.S. Pat. No. 5,203,942 describes a lamination/delamination system as applied to a drum laminator.

U.S. patent application Ser. No. 09/133,243, abandoned, provides for belt roller arrangement which applies a tapering pressure to a lamination sandwich (hereinafter referred to as media to be laminated), and conveys the media to be laminated to a nip portion between heated pressure rollers. The belt materials used are either metal or thermoplastics. In addition, the belts need to survive cycled heat and pressures and preferably, to be a seamless polyimide belt. However, the high surface energy of the polyimide belts pickup dirt, dusts or contamination from the media. The polyimide belt failed to release the media during usage. There is a need for an overcoat with desired heat resistance and release properties.

U.S. patent application Ser. No. 08/782,899 U.S. Pat. No. 5,948,491 describes an improved toner fuser member and new adhesion priming composition which improve the adhesion between the fluoropolymer and the epoxy substrate. However, it leaves unsolved the problem of adhesion between PTFE and the organic polymer binder.

One commercially available polymer for lamination belt overcoat is polytetrafluoroethylene (PTFE) dispersion from Whitford. This overcoat provides a low surface energy surface to help release the media. However, within few hours of heating and pressure under normal usage, a white flake built up on the surface and image artifacts occurred. Also, a noticeable loss of release properties was observed. It is believed the PTFE could not hold within the overcoat. There is a need for an additive to reinforce the integrity of the overcoat.

SUMMARY OF THE INVENTION

In accordance with the present invention, there is disclosed a laminator member for color proofing comprising a belt substrate and a surface layer, said surface layer comprising a polyamide-imide organic polymer binder; a fluorinated resin polymer; and a perfluoroalkylsubstituted fluororesin-reactive compound having the formula:

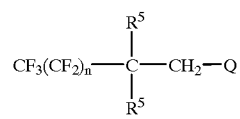

where $R^5$ is H or F; Q is OH, $SiR^6R^7R^8$; $R^6$, $R^7$, and $R^8$ being independently selected from the group consisting of Cl, OH, an alkyl group containing 1 to about 4 carbon atoms, an alkoxy group containing 1 to about 4 carbon atoms, an acyloxy group containing 2 to about 4 carbon atoms, and an amino group containing 0 to about 4 carbon atoms; and n is an integer from 1 to about 15; with the proviso that, at least one of $R^6$, $R^7$, and $R^8$ is Cl, OH, or an alkoxy, acyloxy, or amino group; and wherein said surface layer is adhered to said belt substrate by the polyamide-imide polymer binder.

The laminator member of the invention comprises a substrate to which is adhered a surface layer comprising PTFE in the form of small particle slurry before coating. The lamination substrate comprises polyimide in the shape of a cylinder or, preferably, a seamless belt. The PTFE particles are bonded by a organic polymer binder. The organic polymer binder is polyimide-amide as described in the above formula. Polyamide-imide priming agent can be prepared by the method taught by U.S. Pat. No. 4,087,394.

The additive in the present invention interacts with both the organic polymer binder and the PTFE particles. It also improves the binding between the PTFE and the polyimide substrate due to the dual functionality of the coupling reagent. The lamination belt member with the present invention is characterised by good release and excellent integrity of the overcoat during the life of the belts.

DETAILED DESCRIPTION OF THE INVENTION

The present description will be directed, in particular, to elements forming part of, or cooperating more directly with, a laminator belt in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making image proofs on a paper receiver stock, since the usual proofing practice is to make a hard copy of the image proof on paper. The present invention, however, is not limited to making hard copies of proof images on paper, since it can produce hard copies of images on a wide variety and thicknesses of media that may be used in the printing process or other uses requiring heat and/or pressure to laminate.

In accordance with the present invention, the laminator belt is a seamless polyimide belt having a novel combination of coating, which will be described hereinafter. An important advantage of a polyimide as a substrate for the coated belt is that it can be fabricated as a seamless belt, thus avoiding the disadvantage of belts having seams, in that the seams become visible in the proof image.

Polyimides useful as fusing belts substrate are disclosed in U.S. Pat. No. 5,411,779, which is incorporated herein by reference. As disclosed in the cited patent, the polyimide can be prepared in tubular or belt form by coating a poly(amic acid) solution on the inner circumference of a cylinder and imidizing the poly(amic acid) to form a tubular inner layer of the polyimide resin. The poly(amic acid) can be obtained by reacting a tetracarboxylic dianhydride or derivative thereof with an approximately equimolar amount of a diamine in an organic polar solvent. Examples of tetracarboxylic dianhydrides, diamines, solvents and reaction procedures are disclosed in the cited patent, especially in columns 4–6 and in the numbered examples.

The fluoropolymer resin layer consists of a fluoropolymer material, such as a semicrystalline fluoropolymer, a semicrystalline fluoropolymer or an amorphous fluoropolymer composite. Such materials include polytetrafluoroethylene (PTFE), polyperfluoroalkoxyl-tetrafluoroethylene (PFA), polyfluorinated ethylene-propylene (FEP), poly (ethylenetetrafluoroethylene), polyvinylfluoride, polyvinylidene fluoride, polychlorotrifluoroethylene (PCTFE), poly(ethylene-chloro-trifluoroethylene), 2,2-Bistrifluoromethyl-4,5-difluoro-1,3-dioxole (Teflon AF), and mixtures of fluoropolymer resins. Some of these fluoropolymer resins are commercially available from DuPont as Teflon™. or Silverstone™ materials.

The preferred fluoropolymer resin layer consists of PTFE, commercially available from Whitford under the trade name Xylan™ 1010. It is preferred because it is durable, abrasion resistant and forms a very smooth release layer.

The organic polymer binder for the fluoropolymer resin layer consists of polymer selected from polyamides, polyimides, polyamide-imides and mixtures of these.

The overcoat can be the product of sintering an aqueous dispersion of fluoropolymer resin and a polymer selected from the group consisting of polyamic acids and polyamides. Generally, upon heating, polyamic acids undergo a condensation reaction to form different polymers, for example, polyimides, polyamide-imides, polyether-imides, polybenzoxyazoles, polybenzimidazoles, and polybenzthiazoles. (It is possible that some of the polyamic acids in the primer will have already undergone the condensation reaction before heating.) The preferred polyamic acids for use in the primer composition of this invention are those that are precursors to polyimides and polyamide-imides, that is polyamic acids that will form polyimides or polyamide-imides upon heating.

One way to form polyamic acids is by the reaction of an aromatic dianhydride and an aromatic amine in an aqueous solution. This reaction is tailored to produce polyamic acids that are precursors to the desired polymer, such as, polyimides or polyamide-imides. This reaction and others are well known in the art. See, Principles of Polymerization, 2nd Ed., George Odian, pp. 153–154, John Wiley & Sons, Inc. and Textbook of Polymer Science, 3rd Ed., Fred W. Billmyer, Jr., pp. 427–28, John Wiley & Sons, Inc. Many polyamic acids are commercially available. Examples of commercially available polyamic acids which form polyimides when cured include: Ultem ™, Larc™, Avimid™ K111, Exmid™ and Kapton™. An example of a polyamic acid that forms a polyamide-imide when cured is Torlon™, available from Amoco. An example of a polyamic acid that forms a polyether-imide when cured is Ultem™ available from General Electric. The polyamic acids which are mixed with the fluoropolymer resins to form the binder layer material are and will be generally referred to by the polymers they produce when heated, such as, polyimides, or polyamide-imide; however, it is understood that the organic polymer binder mostly consists of the unreacted polyamic acids or polyamides until it is heated, at which time, it may consist of a polyimide, polyamide-imide or polyamide. The polymer binder is heated either after it is applied or preferably after the application of the fluoropolymer resin layer during the sintering of the fluoropolymer resin layer. The fluoropolymer resins in the overcoat composition can be any of the previously disclosed fluoropolymer resins, such as, polytetrafluoroethylene, polyperfluoroalkoxy-tetrafluoroethylene, polyfluorinated ethylene-propylene. The preferred composition consist of 18 to 39.9 weight percent fluoropolymer resins preferably polytetrafluoroethylene, and 60 to 80 weight percent organic polymer binder, preferably polyamic acids, in an aqueous dispersion. The novel additive from this invention is in the amount of 0.1 to 2 percent of the fluoropolymer coating mixture. Preferable fluoropolymer coating mixture consists of a polyamide-imide-fluoropolymer resin which can be prepared by the method taught in U.S. Pat. No. 4,087,394, which is incorporated herein by reference. The polyamide or polyimide and fluoropolymer resin mixture overcoat can be made similarly. The most preferable polyamide-imide-fluoropolymer resin mixture overcoat is Xylan™ 1010 supplied by Whitford.

In accordance with the present invention, the perfluoroalkylsubstituted fluororesin-reactive compound has the formula

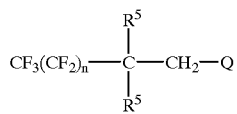

where $R^5$ is H or F, Q is OH or $SiR^6R^7R^8$; $R^6$, $R^7$, and $R^8$ being independently selected from the group consisting of Cl, OH, an alkyl group containing 1 to about 4 carbon atoms, an alkoxy group containing 1 to about 4 carbon atoms, an acyloxy group containing 2 to about 4 carbon atoms, and an amino group containing 0 to about 4 carbon atoms; and n is an integer from 1 to about 15; with the proviso that, at least one of $R^6$, $R^7$, and $R^8$ is Cl, OH, or an alkoxy, acyloxy, or amino group. The priming agent composition comprises the perfluoroalkylsubstituted fluororesin-reactive compound containing 7 to 21 fluorine atoms.

The priming agent composition of perfluoroalkylsubstituted fluororesin-reactive compound is selected from the group consisting of $CF_3(CF_2)_7CH_2CH_2Si(OC_2H_5)_3$, $CF_3(CF_2)_5CH_2CH_2SiCH_3Cl_2$, $CF_3(CF_2)_8CH_2CH_2OH$, $(CF_3(CF_2)_9CH_2OH$ and mixture thereof.

The release coating layer composition is then comprise about 60 to 80% by weight of organic polymer binder, 18 to 39.9% by weight of fluorinated resin and about 0.1 to 2% by weight of said perfluoroalkylsubstituted fluororesin-reactive compound.

The present invention further provides for a method of laminating media that comprises the steps of passing a media to be laminated between first and second coated seamless belts which apply a first pressure to the media; and providing a second pressure to the media passing between the first and second coated seamless belts by way of first and second opposing pressure rollers respectively located within each of the first and second coated seamless belts. Both first and second pressure rollers are heated pressure rollers. A further step of providing a third pressure to the media passing between the first and second coated seamless belts is applied. It is done by way of positioning first and second plates with the first and second coated seamless belts.

The present invention further provides for a method of laminating media that comprises the steps of passing a media to be laminated between first and second pressure roller arrangements which apply a first pressure to the media, such that at least one of the first and second pressure roller arrangements comprises an idler roller, a pressure roller and the coated seamless belt which surrounds the idler roller and the pressure roller; and applying a second pressure to the media passing between the first and second pressure arrangements by way of a plate assembly. Here, the pressure roller is a heated pressure roller.

Methods for preparing the coating, testing and examples of the invention follow.

Materials

Heptadecafluoro-1,1,2,2,-tetrahydrodecyl-triethoxysilane (SIH5841-2) from Gelest, Inc., Tullytown, Pa.

HCl from Aldrich, Milwaukee, Wis.

Tetrahydrofuran (THF)\99.9% anhydrous from Aldrich, Milwaukee, Wis.

Xylan™ 1010 DF 870 Black from Whitford Corporation, West Chester, Pa.

Polyimide belt from IST Co., Japan

EXAMPLE 1

Preparation of Additive and Coating Solution

Dilute HCl with water to 0.15N solution. To prepare the additive solution, dissolve 0.35 grams of SIH5841-2 to 6.7 grams THF. Let the solution stir for ten minutes. Add one drop of 0.15N HCl into the solution and stir for another ten minutes. The additive solution is then add into 100 grams of Xylan™ 1010 DF 870 black to form the coating solution.

EXAMPLE 2

Preparation of a Lamination Belt

The imide belt was air blustered to clean any dirt and hung on a rotational rod. Coating solution from example 1 was applied by a spray gun and sprayed uniformly onto the belt surface by two passes with the imide belt rotated on the rotational rod. After the coating was applied, the coated belt was cured at 350° F. for 30 minutes. A smooth coating with 30–40 um thickness formed after curing.

EXAMPLE 3

Lamination Belt Test

The coated belts were mounted on Kodak Approval 800 Laminator for online lamination testing. The belts were idling under 150° C. and pressure for seven days. Meanwhile, different types of media were passing through the laminator for release test. Excellent release property observed.

What is claimed is:

1. A laminator member for color proofing comprising:
   a belt substrate; and
   a surface layer, said surface layer comprising:
      a polyamide-imide organic polymer binder;
      a fluorinated resin polymer; and
      a perfluoroalkylsubstituted fluororesin-reactive compound having the formula:

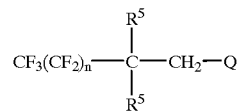

where $R^5$ is H or F; Q is OH, $SiR^6R^7R^8$; $R^6$, $R^7$, and $R^8$ being independently selected from the group consisting of Cl, OH, an alkyl group containing 1 to about 4 carbon atoms, an alkoxy group containing 1 to about 4 carbon atoms, an acyloxy group containing 2 to about 4 carbon atoms, and an amino group containing 0 to about 4 carbon atoms; and n is an integer from 1 to about 15; with the proviso that, at least one of $R^6$, $R^7$, and $R^8$ is Cl, OH, or an alkoxy, acyloxy, or amino group; and wherein said surface layer is adhered to said belt substrate by the polyamide-imide polymer binder.

2. A laminator member according to claim 1 wherein said fluorinated resin polymer is in a finely divided particulate form and said polyamide-imide polymer binder is a cured polymer.

3. A laminator member according to claim 1 wherein said belt substrate is a cured polymer selected from polyimide, polyamide and polyamide-imide.

4. A laminator member according to claim 1 wherein the polyamide-imide polymer binder:the fluorinated resin polymer:the perfluoroalkylsubstituted fluororesin-reactive compound of the surface layer has a ratio between 80:18:2 to 60:39.9:0.1.

5. A laminator member according to claim 1 wherein the fluorinated resin polymer is selected from the group consisting of polytetrafluoroethylene (PTFE), polyperfluoroalkoxyl-tetrafluoroethylene (PFA), polyfluorinated ethylene-propylene (FEP), poly(ethylenetetrafluoroethylene), polyvinylfluoride, polyvinylidene fluoride, polychlorotrifluoroethylene (PCTFE), poly(ethylene-chloro-trifluoroethylene), 2,2-Bistrifluoromethyl-4,5-difluoro-1,3-dioxole (Teflon AF), and mixtures of fluoropolymer resins.

6. The laminator member of claim 1 wherein in the formula for perfluoroalkylsubstituted fluororesin-reactive compound Q is OH.

7. The laminator member of claim 1 wherein in the formula for perfluoroalkylsubstituted fluororesin-reactive compound Q is $SiR^6R^7R^8$, and at least one of $R^6$, $R^7$, and $R^8$ is Cl.

8. The laminator member of claim 1 wherein in the formula for perfluoroalkylsubstituted fluororesin-reactive compound Q is $SiR^6R^7R^8$, and at least one of $R^6$, $R^7$, and $R_8$ is an alkoxyl group.

9. The laminator member of claim 1 wherein in the formula for perfluoroalkylsubstituted fluororesin-reactive compound Q is $SiR^6R^7R^8$, and at least one of $R^6$, $R^7$, and $R^8$ is either a methoxy or an ethoxy.

10. The laminator member of claim 1 wherein the perfluoroalkylsubstituted fluororesin-reactive compound contains 7–21 fluorine atoms.

11. The laminator member of claim 8 wherein said perfluoroalkylsubstituted fluororesin-reactive compound is selected from the group of $CF_3(CF_2)_7CH_2CH_2Si(OC_2H_5)_3$, $CF_3(CF_2)_5CH_2CH_2SiCH_3Cl_2$, $CF_3(CF_2)_8CH_2CH_2OH$, $CF_3(CF_2)_9CH_2OH$ and mixtures thereof.

* * * * *